(12) United States Patent
Rodney S. et al.

(10) Patent No.: US 11,993,822 B2
(45) Date of Patent: May 28, 2024

(54) MONOCRYSTALLINE METAL FOIL AND MANUFACTURING METHOD THEREFOR

(71) Applicants: INSTITUTE FOR BASIC SCIENCE, Daejeon (KR); UNIST(ULSAN NATIONAL INSTITUTE OF SCIENCE AND TECHNOLOGY), Ulsan (KR)

(72) Inventors: Ruoff Rodney S., Ulsan (KR); Sunghwan Jin, Ulsan (KR)

(73) Assignees: INSTITUTE FOR BASIC SCIENCE, Daejeon (KR); UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 141 days.

(21) Appl. No.: 16/767,751

(22) PCT Filed: Dec. 13, 2018

(86) PCT No.: PCT/IB2018/059992
§ 371 (c)(1),
(2) Date: May 28, 2020

(87) PCT Pub. No.: WO2019/106644
PCT Pub. Date: Jun. 6, 2019

(65) Prior Publication Data
US 2021/0002736 A1    Jan. 7, 2021

(30) Foreign Application Priority Data
Nov. 28, 2017    (KR) .......................... 10-2017-0160210

(51) Int. Cl.
*C21D 1/40*    (2006.01)
*C21D 9/46*    (2006.01)
(Continued)

(52) U.S. Cl.
CPC .................. *C21D 1/40* (2013.01); *C21D 9/46* (2013.01); *C22F 1/002* (2013.01); *C22F 1/14* (2013.01); *C30B 35/00* (2013.01)

(58) Field of Classification Search
CPC .... C21D 1/40; C21D 9/46; C22F 1/14; C30B 35/00; C30B 1/02; C30B 1/04
See application file for complete search history.

(56) References Cited

U.S. PATENT DOCUMENTS 7,922,812 B2 * 4/2011 Ciulik ....................... C30B 1/02
117/7
2009/0120351 A1 * 5/2009 Ciulik ....................... C30B 1/04
117/200

FOREIGN PATENT DOCUMENTS

CN     104425795 A   *   3/2015   ........ H01M 10/0525
JP     10-298000 A       11/1998
(Continued)

OTHER PUBLICATIONS

Qiu Zheng, Tetsuhide Shimizu, Tomomi Shiratori, Ming Yang, Tensile Properties and Constitutive Model of Ultrathin Pure Titanium Foils at Elevated Temperatures in Microforming Assisted by Resistance Heating Method, 2014, Elsevier, Materials and Design 63, pp. 389-397 (Year: 2014).*

(Continued)

*Primary Examiner* — Nicholas A Wang
*Assistant Examiner* — Maxwell Xavier Duffy
(74) *Attorney, Agent, or Firm* — Hauptman Ham, LLP

(57) ABSTRACT

The present invention relates to a method for manufacturing a monocrystalline metal foil and a monocrystalline metal foil manufactured thereby, the method comprising the steps of: fixing each of the ends of a polycrystalline metal foil to electrodes; and heat-treating the fixed polycrystalline metal foil to manufacture a monocrystalline metal foil.

10 Claims, 4 Drawing Sheets

(51) Int. Cl.
*C22F 1/00* (2006.01)
*C22F 1/14* (2006.01)
*C30B 35/00* (2006.01)

(56) References Cited

FOREIGN PATENT DOCUMENTS

| KR | 10-2008-0019224 A | 3/2008 |
| KR | 10-2013-0020351 A | 2/2013 |
| KR | 10-1425498 B1 | 8/2014 |
| KR | 10-2014-0137301 A | 12/2014 |
| KR | 10-2015-0141139 A | 12/2015 |
| KR | 10-2018-0007334 A | 1/2018 |

OTHER PUBLICATIONS

Steve Ruoff and Thomas Philips, Furnace Atmospheres for Heat Treating, 2014, ASM Handbook, vol. 4B, Steel Heat Treating Technologies, pp. 108-134 (Year: 2014).*
Chen et al., CN-104425795-A description machine translation, 2015 (Year: 2015).*
International Search Report dated Apr. 1, 2019, in connection with corresponding International Patent Application No. PCT/IB2018/059992.
A. Kumar et al., "Rapid synthesis of few-layer graphene over Cu foil", Carbon (2012), vol. 50, pp. 1546-1553.
[Supportive Materials for Exception to Loss of Novelty] Sunghwan Jin et al., "Colossal grain growth yields single-crystal metal foils by contact-free annealing", Science 362, Nov. 30, 2018, pp. 1021-1025.
Korean Office Action dated Dec. 9, 2021, in connection with the Korean Patent Application No. 10-2017-0160210.

* cited by examiner

MONOCRYSTALLINE METAL FOIL AND MANUFACTURING METHOD THEREFOR

CROSS-REFERENCE TO RELATED APPLICATION

The present application is a national stage filing under 35 U.S.C § 371 of PCT application number PCT/IB2018/059992 filed on Dec. 13, 2018 which is based upon and claims the benefit of priorities to Korean Patent Application No. 10-2017-0160210, filed on Nov. 28, 2017 in the Korean Intellectual Property Office, which are incorporated herein in their entireties by reference.

TECHNICAL FIELD

The present invention relates to a monocrystalline metal foil and a method for manufacturing the same, and more particularly, to a method for manufacturing a large area monocrystalline metal foil by performing a heat treatment under a condition at which stress applied to a polycrystalline metal foil is minimized, and a monocrystalline metal foil manufactured by the same.

BACKGROUND ART

A monocrystalline metal refers to a material in which an entire sample thereof is formed of a single crystal without grain boundaries, and is known to exhibit unique properties compared to a polycrystalline metal. It has been reported that monocrystalline copper has a higher electrical conductivity than polycrystalline copper and silver because there is no electron scattering at grain boundaries. It has been reported that a monocrystalline superalloy has excellent creep resistance because there is no slip at grain boundaries. In addition, monocrystalline metals can be used as catalysts for various chemical reactions such as carbon monoxide (CO) oxidation and oxygen ($O_2$) reduction due to their uniform surface crystal orientation. Recently, many researchers have an interest in utilization of monocrystalline metals for growth of two-dimensional nanomaterials including graphenes.

Meanwhile, graphene is a two-dimensional nanomaterial having excellent charge mobility, optical transparency, mechanical strength, flexibility, and environmental resistance, can be applied to various fields such as a multifunctional nanocomposite material, a transparent electrode material, and a next-generation semiconductor device.

As a method for preparing graphene in large area, a chemical vapor deposition (CVD) method has been widely used. CVD method synthesizes graphene from a carbon-containing precursor at a high temperature by using a transition metal catalyst substrate.

It is known that graphene can be grown epitaxially with respect to an atomic structure of a transition metal substrate during the preparation of graphene by the CVD method. Since a commercially available poly-crystalline transition metal substrate is mainly used, but mostly, polycrystalline graphene is obtained by CVD.

In the polycrystalline graphene, scattering of carriers and phonons, and stress concentration occur at grain boundaries, such that the polycrystalline graphene exhibits relatively more inferior properties than monocrystalline graphene.

Accordingly, the development of a method capable of forming a monocrystalline metal layer in large area is essential for synthesizing monocrystalline graphene in large area.

In order to manufacture a monocrystalline metal, an epitaxial growth of a metal on a monocrystalline sapphire substrate through a thermal evaporation method, an electron beam evaporation method, a sputtering method, and synthesizing graphene based thereon has been reported. However, since an expensive monocrystalline substrate should be used in this technology, there are disadvantages in that an area is restrictive, and economical efficiency is low (Korean Patent Laid-Open Publication No. 10-2013-0020351).

Instead of a method for forming a metal layer on an expensive monocrystalline substrate, a method for controlling an injection amount and an injection rate of hydrogen or hydrogen-argon mixed gas, a temperature, a pressure, and a heat treatment time, and the like, to convert a commercially available polycrystalline metal thin film into a monocrystalline metal thin film has been reported (Korean Patent Laid-Open Publication No. 10-2014-0137301).

However, in Korean Patent Laid-Open Publication No. 10-2014-0137301, when a thickness of a polycrystalline copper thin film is more than 18 μm, since grains and grain boundaries remain in the copper thin film as they are in spite of performing a heat treatment under an optimal condition, a truly monocrystalline copper thin film may not be manufactured, and thus, a thickness of a usable polycrystalline copper thin film is limited in a significantly narrow range of 5 to 18 μm.

In addition, in the case of performing a heat treatment without a substrate, there is a problem in that as the heat treatment is performed in a state in which a polycrystalline copper thin film is put into a chamber as it is to come in direct contact with a bottom surface of the chamber, and grain growth pinning may occur from a contact region of the copper thin film, or stress may be generated due to thermal deformation of a metal thin film caused by a high-temperature heat treatment, such that conversion to monocrystalline film does not effectively occur, thereby forming a polycrystalline copper thin film.

Therefore, the present inventors conducted intensive studies in order to manufacture a monocrystalline metal foil having a large area by suppressing stress generated by thermal deformation, thereby completing the present invention.

DISCLOSURE

Technical Problem

In order to solve the above problems, an object of the present invention is to provide a method for manufacturing a monocrystalline (single-crystalline) metal foil having a large area by performing a heat treatment under a condition at which stress applied to a polycrystalline metal foil is minimized, and a monocrystalline metal foil manufactured by the same.

Technical Solution

In one general aspect, a method for manufacturing a monocrystalline metal foil includes: a) a step of fixing each of the ends of a polycrystalline metal foil by electrodes, respectively; and b) a step of heat treating the fixed polycrystalline metal foil to manufacture a monocrystalline metal foil.

The heat treatment may be performed by resistive heating.

The step a) may be performed by further including a step of straightening the polycrystalline metal foil by moving one or more electrodes that are attached to the ends of the polycrystalline metal foil, respectively.

The step b) may be performed by including: i) a primary heat treatment step of increasing a temperature of the polycrystalline metal foil by applying a current to the electrode; and ii) a secondary heat treatment step of performing annealing at a finally increased temperature for a predetermined time.

In addition, the polycrystalline metal foil whose length is increased by thermal expansion during the heat treatment in the step b) may be kept straight.

In the step i), the polycrystalline metal foil whose length is increased may be kept straight by moving one or more electrodes that are attached to the ends of the polycrystalline metal foil, respectively.

In addition, the step i) may be performed so that the following Relational Expression 1 is satisfied.

$$(L_1-L_0)\times 0.5 \le M_{Elo}(L_1-L_0)\times 1.5$$ [Relational Expression 1]

(In Relational Expression 1, $M_{Elo}$ represents a displacement increased by moving one or more electrodes that are attached to the polycrystalline metal foil, respectively, $L_0$ represents a length of the polycrystalline metal foil before the primary heat treatment, and $L_1$ represents a length of the polycrystalline metal foil whose length is increased by thermal expansion through the primary heat treatment.)

In addition, in the primary heat treatment in the step i), the temperature may be increased up to a temperature in the secondary heat treatment in the step ii). The temperature in the secondary heat treatment may satisfy the following Relational Expression 2.

$$0.3\times T_m \le T < T_m$$ [Relational Expression 2]

(In Relational Expression 2, T represents a temperature (° C.) in the secondary heat treatment, and $T_m$ represents a melting point temperature (° C.) of a metal of the polycrystalline metal foil.)

In addition, a thickness of the polycrystalline metal foil may be 5 to 200 μm. A metal of the polycrystalline metal foil may be a copper (Cu), nickel (Ni), cobalt (Co), iron (Fe), ruthenium (Ru), rhodium (Rh), palladium (Pd), platinum (Pt), silver (Ag), rhenium (Re), iridium (Ir), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn).

In addition, the monocrystalline metal foil may have the same crystal plane on both surfaces thereof. The monocrystalline metal foil may have a (110), (111), (001), (112), (123), or (0001) crystal plane based on a direction perpendicular to a plane.

In addition, the heat treatment may be performed under a hydrogen gas atmosphere, an argon gas atmosphere, or a hydrogen-argon mixed gas atmosphere.

In another general aspect, there is provided a monocrystalline metal foil manufactured by the method described above.

In still another general aspect, there is provided a monocrystalline metal foil having the same crystal plane on both surfaces thereof and a thickness of 5 to 200 μm.

In the monocrystalline metal foil, the following Relational Expression 3 may be satisfied.

$$95 \le (A_{normal}/A_{total})\times 100$$ [Relational Expression 3]

(In Relational Expression 3, $A_{total}$ represents a total area of a specimen except for regions fixed by the electrodes, and $A_{normal}$ represents an area of grains having the same crystal plane in a plane normal direction in the specimen, where the same crystal plane is a (110), (111), (001), (112), (123), or (0001) crystal plane.)

In still another general aspect, an apparatus for manufacturing a monocrystalline metal foil includes: a chamber; and a metal foil heating unit, wherein the chamber includes: a first fixing unit and a second fixing unit positioned to be spaced apart from each other and provided to fix a polycrystalline metal foil; and a distance adjustment unit connected to the first fixing unit, the second fixing unit, or the first fixing unit and the second fixing unit to adjust a spaced distance between the first fixing unit and the second fixing unit.

The first fixing unit and the second fixing unit may include a first electrode and a second electrode, respectively, to be electrified, and the "metal foil heating unit" is connected to the first electrode and the second electrode The metal foil heating unit may include a heater separated from the first fixing unit and the second fixing unit and that is placed inside or outside the chamber.

The metal foil heating unit may perform heating by resistive heating.

The metal foil heating unit may further include a cooling device.

The apparatus may further include a gas inlet injecting gas to the chamber; and a gas outlet discharging the gas from the chamber.

The apparatus may further include a pressure adjustment unit connected to the chamber.

Advantageous Effects

In the method for manufacturing a monocrystalline metal foil according to the present invention, each of the ends of the polycrystalline metal foil are fixed by the electrodes, respectively, such that a metal foil region (a region except for end portions fixed by the electrodes), which can be converted to being a monocrystalline region, does not come in contact with other materials. Therefore, an occurrence of a grain growth pinning from a contact portion may be minimized.

In addition, even in a case where each of the ends of the polycrystalline metal foil are fixed by the electrodes, respectively, and the length of the polycrystalline metal foil is increased by the thermal expansion during the heat treatment, the polycrystalline metal foil is kept straight by moving the positions of the electrodes and then the heat treatment is performed, such that undesirable stress is prevented. Therefore, a monocrystalline metal foil having a large area may be manufactured.

In addition, as both surfaces of the poly-crystalline metal foil may be thermally treated under the same conditions as each other by positioning the poly-crystalline metal foil to be spaced apart from others, such as a chamber, conversion to monocrystalline metal foil may be more effectively performed. Therefore, the manufactured monocrystalline metal foil may have the same crystal plane on both surfaces thereof.

Figure 3:
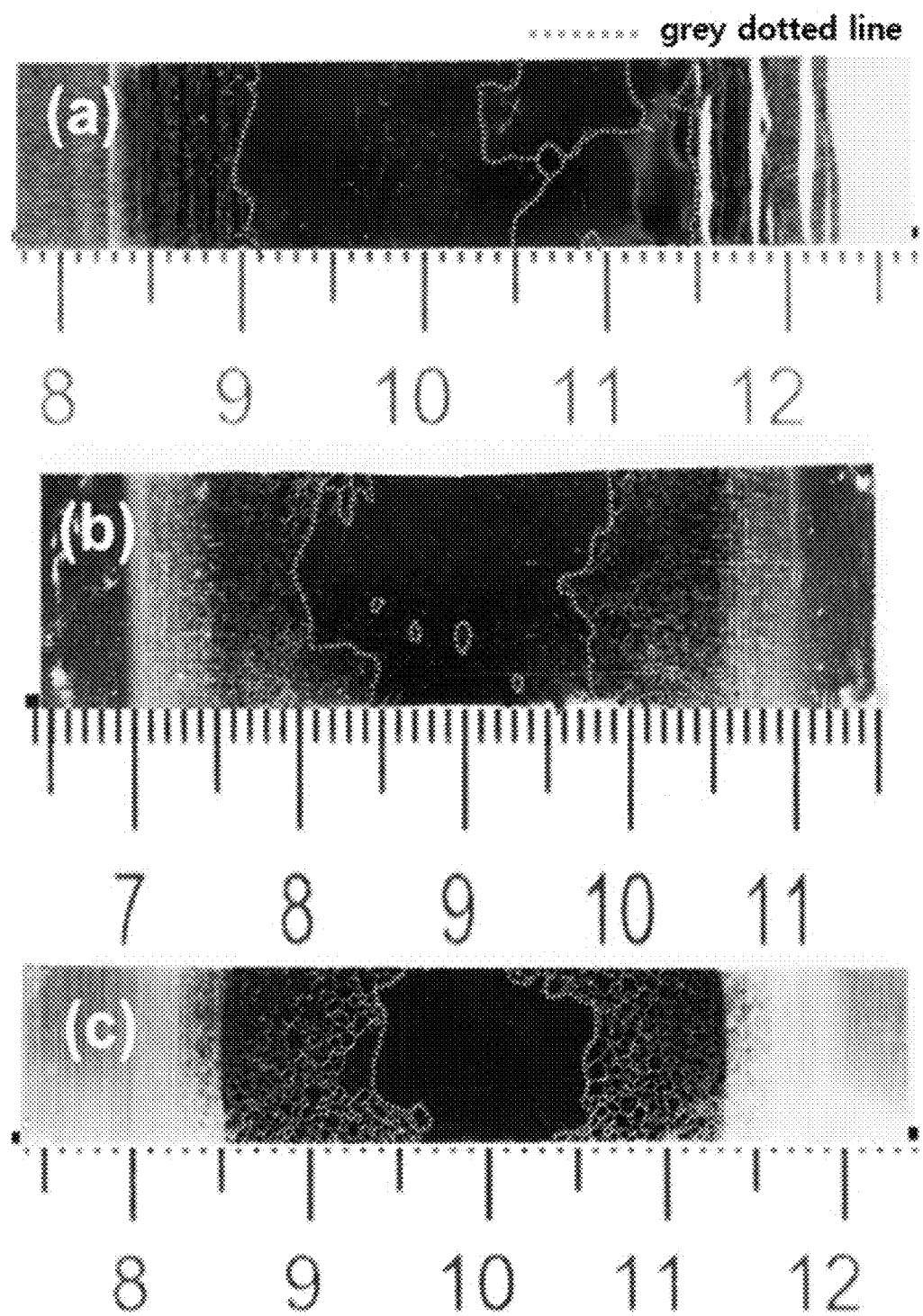

(a), (b), and (c) of FIG. 3 are photographs of monocrystalline metal foils manufactured by heat treatments of nickel (a), palladium (b), and cobalt (c) metal foils at 1380° C. for 3 hours, 1400° C. for 3 hours, and 1400° C. for 6 hours, respectively, according to the method suggested in the present invention.

Figure 1A:
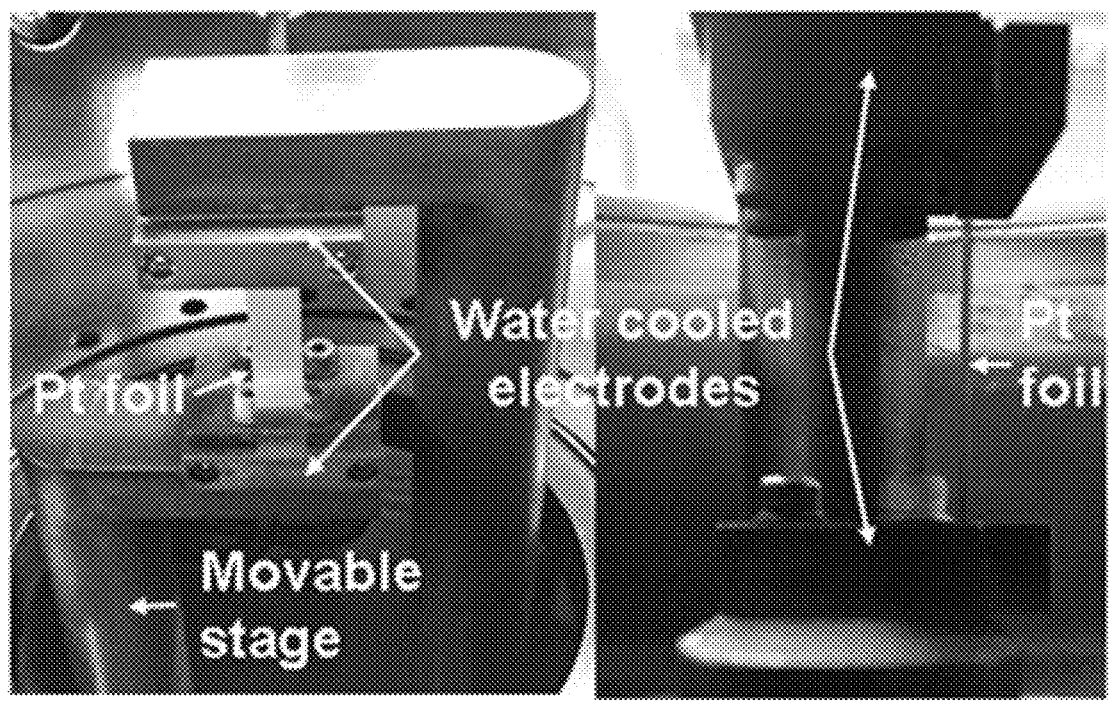
FIG. 1a is a photograph showing a method for manufacturing a monocrystalline metal foil by moving a lower electrode downwards by an increased length of a polycrystalline platinum foil by thermal expansion through a primary heat treatment according to an exemplary embodiment of the present invention.
Figure 1B:
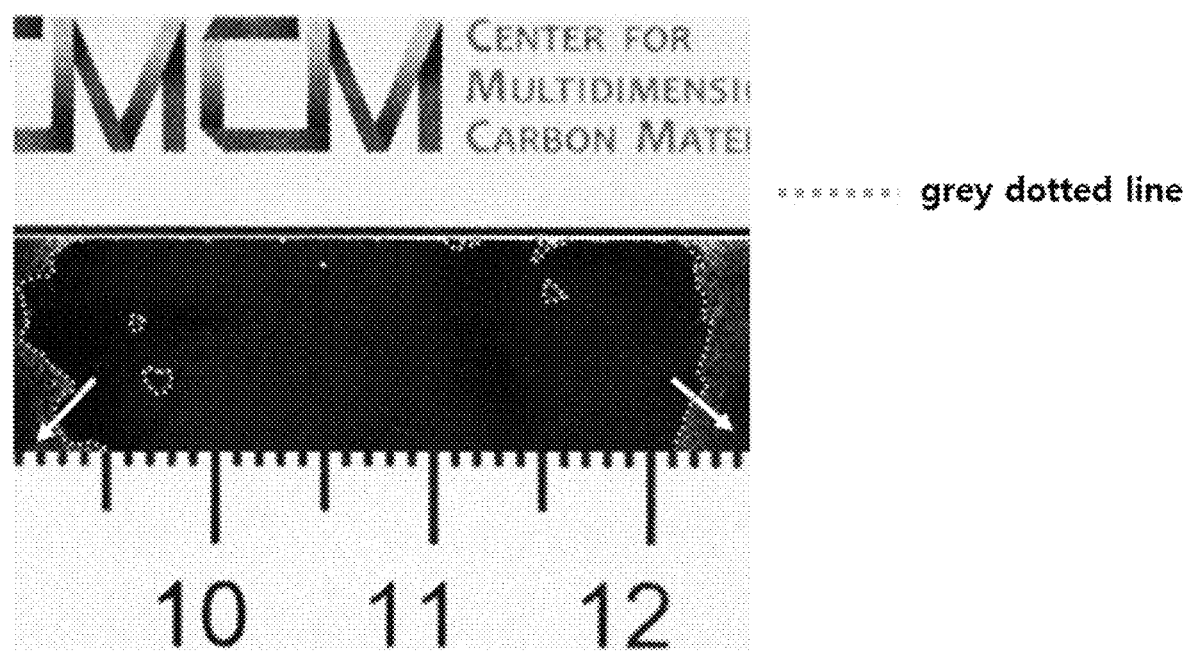
FIG. 1B is a photograph of a monocrystalline platinum foil subjected up to a secondary heat treatment under the same condition, wherein it may be confirmed that a grain boundary is not formed due to minimization of bending of the foil as compared with a platinum foil of FIG. 2. It should be noted that both ends of a specimen, that is, regions denoted by the arrows adjacent to both electrodes are polycrystalline regions, and they come from temperature drop near the electrodes by a heating unit provided with a cooling device.
Figure 2A:
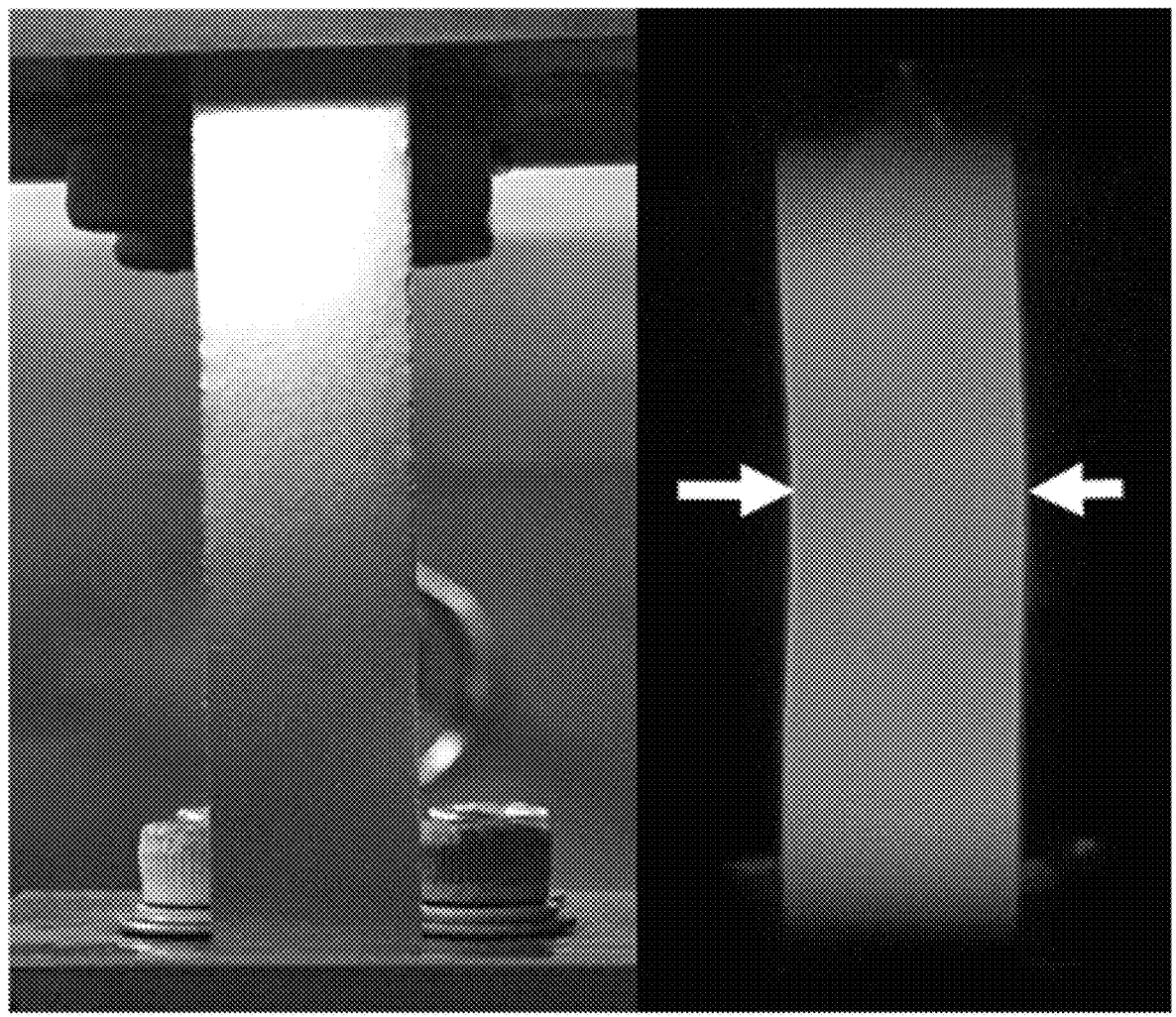
FIG. 2a is a photograph showing that warpage or bending occurs at a middle portion of the polycrystalline platinum foil due to the stress concentration when the lower electrode is not moved downwards according the increased length of the polycrystalline platinum foil by the thermal expansion through the primary heat treatment.
Figure 2B:
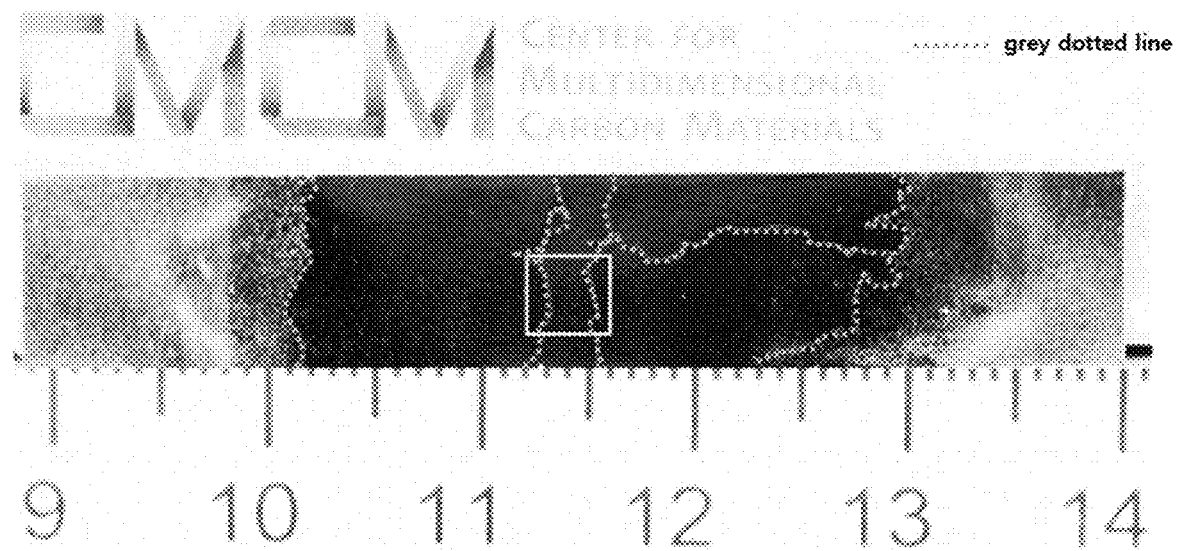
FIG. 2b is a photograph of the platinum foil subjected up to a secondary heat treatment under the same condition, wherein it may be confirmed that a grain boundary is formed at the portion in which warpage or bending occurs.

The grey dotted lines in the photographs of the metal foils illustrated in FIGS. 1B, 2b and 3 indicate grain boundaries between a monocrystalline region and a polycrystalline region or grain boundaries between monocrystalline regions having a size in several centimeters.

BEST MODE

Hereinafter, a monocrystalline metal foil and a method for manufacturing the same according to the present invention will be described in detail with reference to the accompanying drawings.

The drawings to be described below are provided by way of example so that the spirit of the present invention can be sufficiently transferred to those skilled in the art. Therefore, the present invention is not limited to the drawings suggested below but may be modified in many different forms. In addition, the drawings suggested below will be exaggerated in order to clarify the spirit of the present invention. Technical terms and scientific terms used herein have the general meanings understood by those skilled in the art to which the present invention pertains unless otherwise defined, and a description for the known function and configuration obscuring the present invention will be omitted in the following description and the accompanying drawings.

The present invention relates to a method for manufacturing a monocrystalline metal foil having a large area by performing a heat treatment under a condition at which stress applied to a polycrystalline metal foil is minimized, and a monocrystalline metal foil manufactured by the same.

In a case of a method for manufacturing a monocrystalline metal foil according to the related art, when a thickness of a polycrystalline copper thin film is more than 18 μm, since grains and grain boundaries remain in the copper thin film as they are in spite of performing a heat treatment under an optimal condition, a truly monocrystalline copper thin film may not be manufactured, and thus, a thickness of a usable polycrystalline copper thin film is limited in a significantly narrow range of 5 to 18 μm.

In addition, in the case of performing thermal treatment without a substrate, there is a problem in that as the thermal treatment is performed in a state in which the poly-crystalline copper foil is put into a chamber as it is to come in direct contact with a bottom surface of the chamber, a grain growth pinning phenomenon may occur based on a contact region of the copper foil, or stress may occur due to thermal deformation of a metal foil caused by high-temperature thermal treatment, such that conversion to monocrystalline foil does not effectively occur, and thus a poly-crystalline copper foil is formed.

Therefore, the present inventors conducted intensive studies in order to manufacture a monocrystalline metal foil having a large area by suppressing stress generated by thermal deformation, thereby completing the present invention.

Specifically, an exemplary embodiment of the present invention relates to a method for manufacturing a monocrystalline metal foil, the method including: a) a step of fixing each of the ends of a polycrystalline metal foil by electrodes, respectively; and b) a step of heat treating the fixed polycrystalline metal foil to manufacture a monocrystalline metal foil.

In the present invention, the each of the ends of the polycrystalline metal foil are fixed by the electrodes, respectively, such that a metal foil region (a region except for end portions fixed by the electrodes), which can be converted to being a monocrystalline region, does not come in contact with other materials. Therefore, the occurrence of grain growth pinning from the contact portion may be minimized.

In addition, as both surfaces of the poly-crystalline metal foil may be thermally treated under the same conditions as each other by positioning the poly-crystalline metal foil to be spaced apart from others, such as a chamber, conversion to monocrystalline metal foil may be more effectively performed. Therefore, the manufactured monocrystalline metal foil may have the same crystal plane on both surfaces thereof. In addition, as the monocrystalline metal foil may have the same crystal plane in each of the in-plane and out-of-plane directions, monocrystalline metal foil having high quality may be manufactured. More specifically, the monocrystalline metal foil may have a (111), (001), (112), (123), or (0001) crystal plane in the plane normal direction.

Hereinafter, the method for manufacturing a monocrystalline metal foil according to an exemplary embodiment of the present invention will be described in more detail.

First, in the method for manufacturing a monocrystalline metal foil according to an exemplary embodiment of the present invention, a) the step of fixing each of the ends of a polycrystalline metal foil by electrodes, respectively, may be performed.

In this case, a method for fixing the each of the ends of the polycrystalline metal foil by the electrodes, respectively, is not particularly limited. For example, the polycrystalline metal foil may be fixed by a method in which the polycrystalline metal foil is positioned between two bars and then is fixed by bolts, or a method in which the polycrystalline metal foil is wound around roll type electrodes. However, this is only one exemplary embodiment, the method is not particularly limited as long as the polycrystalline metal foil may be fixed, and the present invention is not limited thereto.

More specifically, in the step a) according to an exemplary embodiment of the present invention, the step a) may further include a step of keeping the polycrystalline metal foil straight by moving one or more electrodes that are attached to each of the ends of the polycrystalline metal foil, respectively. The step for keeping the foil straight may be performed by moving one or more electrodes in a state in which each of the ends of the polycrystalline metal foil are fixed, and the movement of the electrode may include movement of one electrode or all of the two electrodes. By including the step for keeping the foil straight, the heat treatment may be performed in a state in which the polycrystalline metal foil is kept straight by fixing each of the ends of the polycrystalline metal foil by the electrodes, respectively, and the stress applied to the polycrystalline metal foil may be minimized. Therefore, a monocrystalline metal foil having a large area may be manufactured.

In this case, the polycrystalline metal foil may be kept straight by fixing each of the ends of the polycrystalline metal foil by the two electrodes spaced apart from each other, and a non-fixed portion except for the regions fixed by the two electrodes may be in a state in which it does not come in contact with other materials at all. That is, the non-fixed portion may be in a completely opened state. Therefore, the grain growth pinning caused by contact of the polycrystalline metal foil with other materials and the stress generated by thermal deformation during the heat treatment may be prevented. In this case, the term "keep straight" means a state in which the polycrystalline metal foil is substantially and completely flattened without a wrinkle, crease, or curve.

In addition, in the method for manufacturing a monocrystalline metal foil according to an exemplary embodiment of the present invention, since a monocrystalline metal foil is manufactured by performing a heat treatment while maintaining the polycrystalline metal foil kept straight by fixing each of the ends of the polycrystalline metal foil by the electrodes, respectively, an angle between the polycrystalline metal foil and a bottom surface is not important at all, but the polycrystalline metal foil may form any angle with the bottom surface as long as the polycrystalline metal foil may be kept straight.

Meanwhile, in an exemplary embodiment of the present invention, in order to more effectively convert to monocrystal, it is preferable that a thickness of the polycrystalline metal foil is appropriately adjusted.

As an exemplary embodiment, the thickness of the polycrystalline metal foil may be 5 to 200 μm, preferably 10 to 100 μm, and as a non-limiting example, may be 20 to 100 μm. Within the above range, a monocrystalline metal foil may be effectively manufactured, but this is only a non-limiting example, and the present invention is not limited to the thickness described above. Within the above range, the stress applied to the polycrystalline metal foil is minimized, such that it is possible to manufacture a monocrystalline metal foil having a large area, and to easily handle a specimen. When the thickness is excessively thin, a monocrystalline metal foil having a (111) crystal surface in the plane normal direction may be easily formed by surface energy, but formation of the grain boundary may be increased due to an increase in stress generation due to deformation at the time of thermal treatment, which is not preferable. On the contrary, when the thickness of the metal foil is excessively thick, grain growth may be limited, such that it may be difficult to manufacture the monocrystalline metal foil having a large area.

A material of the polycrystalline metal foil is not particularly limited as long as it is a transition metal, and more specifically, a metal of the polycrystalline metal foil may be copper (Cu), nickel (Ni), cobalt (Co), iron (Fe), ruthenium (Ru), rhodium (Rh), palladium (Pd), platinum (Pt), silver (Ag), rhenium (Re), iridium (Ir), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn).

As an exemplary embodiment, in the case of transition metal foil having a closely packed structure such as a face centered cubic (FCC) or hexagonal close packing (HCP) structure, since a (111) crystal plane in the FCC structure and a (0001) crystal plane in the HCP structure have the lowest surface energy, when thermal treatment is performed near a melting point of a metal under the conditions at which there is no additional external force by a contact with other materials, which can cause gran growth pinning and thermal stress generation by different coefficients of thermal expansion, a FCC metal and a HCP metal are spontaneously converted to have the (111) crystal plane and the (0001) crystal plane, respectively, such that the monocrystalline metal foil having a large area may be formed.

In an exemplary embodiment of the present invention, the step b) may include a step of heat treatment while keeping the polycrystalline metal foil straight to manufacture a monocrystalline metal foil.

As a more specific exemplary embodiment, the step b) may be performed by including: i) a primary heat treatment step of increasing a temperature of the polycrystalline metal foil by applying a current to the electrode; and ii) a secondary heat treatment step of performing annealing at a finally increased temperature for a predetermined time.

During the heat treatment of the polycrystalline metal foil, the length of the polycrystalline metal foil is increased by the thermal expansion, such that stress may be applied to the polycrystalline metal foil. However, in the method for manufacturing a monocrystalline metal foil according to an exemplary embodiment of the present invention, the polycrystalline metal foil whose length is increased is kept straight again and then the heat treatment is performed, such that the stress applied to the polycrystalline metal foil may be minimized. Therefore, the grain growth pinning may be prevented, and thus, a monocrystalline metal foil having a large area may be effectively manufactured.

Specifically, the step i) according to an exemplary embodiment of the present invention is a step of preferentially increasing a temperature under a heat treatment condition for manufacturing a monocrystalline metal foil and then straightening the polycrystalline metal foil. In the step i), the polycrystalline metal foil whose length is increased may be kept straight by moving one or more electrodes that are attached to the ends of the polycrystalline metal foil, respectively. When a temperature is increased to the temperature of the heat treatment condition for manufacturing a monocrystalline metal foil, the length of the polycrystalline metal foil may be increased by a thermal expansion. In this case, as illustrated in FIG. 2a, a region of the polycrystalline metal foil may be partially bent as the length of the polycrystalline metal foil is increased. Therefore, it is very important to keep the polycrystalline metal foil straight by performing the step of straightening the polycrystalline metal while the length of the polycrystalline metal foil is increased by performing the heat treatment.

In the step i) according to an exemplary embodiment of the present invention, a method for keeping the polycrystalline metal foil straight is not particularly limited; however, preferably, the polycrystalline metal foil whose length is increased may be straightened again by moving one electrode or both electrodes of the electrodes fixing each of the ends of the polycrystalline metal foil, respectively.

As described above, even in a case where each of the ends of the polycrystalline metal foil are fixed by the electrodes, respectively, and the length of the polycrystalline metal foil is increased by the thermal expansion through the heat treatment, the polycrystalline metal foil is kept straight by moving positions of the electrodes during the heat treatment, such that undesirable stress is prevented. Therefore, a monocrystalline metal foil having a large area may be manufactured.

More specifically, since the region of the polycrystalline metal foil is partially bent by the thermal expansion under the heat treatment condition in the step i) should be avoided during the manufacturing of a monocrystalline metal foil having a large area, the polycrystalline metal foil needs to be kept straight by moving one or more electrodes. However, a monocrystalline metal foil having a large area may not be manufactured in spite of performing the heat treatment in the step i). Therefore, the heat treatment in the step ii) is performed in order to manufacture a monocrystalline metal foil having a large area, such that a monocrystalline metal foil having a large area may be effectively manufactured.

During the heat treatment of the polycrystalline metal foil, the steps i) and ii) may be continuously performed without a cooling step. As the steps are continuously performed, a process may be simplified, and a monocrystalline metal foil may be easily manufactured without additional movement of the electrode.

In an exemplary embodiment of the present invention, in order to keep the metal foil straight, the movement of the electrode, specifically, for example, the step i) may be performed so that the following Relational Expression 1 is satisfied.

$(L_1-L_0) \times 0.5 \leq M_{Elo} \leq (L_1-L_0) \times 1.5$      [Relational Expression 1]

(In Relational Expression 1, $M_{Elo}$ represents a displacement increased by moving one or more electrodes that are attached to the ends of the polycrystalline metal foil, respectively, $L_0$ represents a length of the polycrystalline metal foil before the primary heat treatment, and $L_1$ represents a length of the polycrystalline metal foil whose length is increased by thermal expansion through the primary heat treatment.)

It is most preferable that a step c) is performed so that, preferably, $(L_1-L_0) \times 0.8 \leq M_{Elo} \leq (L_1-L_0) \times 1.2$ is satisfied, more preferably, $(L_1-L_0) \times 0.9 \leq M_{Elo} \leq (L_1-L_0) \times 1.1$ is satisfied, and most preferably, $(L_1-L_0) = M_{Elo}$ is satisfied, for minimizing generation of stress.

That is, a spaced distance between the two electrodes may be further increased by moving one electrode of the two electrodes in a direction opposite to the other electrode, or a spaced distance between the two electrodes may be further increased by moving the both electrodes in opposite directions to each other, by an increased length of the polycrystalline metal foil. This spaced distance may be further increased by an increased length of the polycrystalline metal foil by the thermal expansion. As a non-limiting exemplary embodiment, when an increased length $(L_1-L_0)$ of the polycrystalline metal foil by the thermal expansion is 1 mm, the movement distance $(M_{Elo})$ of the electrode may be 0.5 to 1.5 mm, more preferably 0.8 to 1.2 mm, still more preferably 0.9 to 1.1 mm, and most preferably 1 mm.

Meanwhile, in an exemplary embodiment of the present invention, in the primary heat treatment in the step i), the temperature may be increased to the temperature of the heat treatment condition for manufacturing a monocrystalline metal foil. Specifically, for example, in the primary heat treatment in the step i), the temperature may be increased up to the temperature in the secondary heat treatment in the step ii). In this case, the temperature in the secondary heat treatment in the step ii) will be described below in detail in the description of the step ii).

In addition, in an exemplary embodiment of the present invention, a time for performing the primary heat treatment in the step i) is not particularly limited and is sufficient as long as it is a time in which the temperature is increased up to the temperature in the secondary heat treatment in the step ii). Specifically, for example, the time for performing the primary heat treatment in the step i) may be 3 to 30 minutes, and more preferably 5 to 20 minutes, but the present invention is not limited thereto.

Subsequently, when the polycrystalline metal foil is kept straight again by the step i), in the step ii), a step of secondarily heat treating the polycrystalline metal foil kept straight again to manufacture a monocrystalline metal foil may be performed.

In this case, the secondary heat treatment may be performed under the same temperature condition as the temperature increased by the primary heat treatment as described above.

As a specific exemplary embodiment, the temperature in the secondary heat treatment may satisfy the following Relational Expression 2.

$0.3 \times T_m \leq T < T_m$      [Relational Expression 2]

(In Relational Expression 2, T represents a temperature (° C.) in the secondary heat treatment, and $T_m$ represents a melting point temperature (° C.) of a metal of the polycrystalline metal foil.)

As such, a monocrystalline metal foil may be effectively manufactured by performing the heat treatment while changing the heat treatment condition depending on the type of metal foil. More specifically, for example, in a case of tungsten having the highest melting point temperature of 3422° C., the heat treatment may be performed at a temperature of about 3400° C. More preferably, the secondary heat treatment may be performed under a temperature condition in which $0.6 \times T_m \leq T < T_m$. It is preferable that the secondary heat treatment is performed at a temperature lower than a melting point of a metal, for effectively manufacturing a monocrystalline metal foil having a large area.

In addition, in an exemplary embodiment of the present invention, a secondary heat treatment time is not particularly limited. However, specifically, for example, the secondary heat treatment is preferably performed for 0.5 to 100 hours, and more preferably 10 to 60 hours, for effectively manufacturing a monocrystalline metal foil having a large area.

Meanwhile, in the method for manufacturing a monocrystalline metal foil according to an exemplary embodiment of the present invention, the heat treatment, specifically, the primary heat treatment and the secondary heat treatment may be performed by the electrodes fixed to each of the ends of the polycrystalline metal foil, respectively. Specifically, for example, the heat treatment may be performed by resistive heating. In this case, the resistive heating may refer to "Joule heating". In addition, in the method for manufacturing a monocrystalline metal foil according to an exemplary embodiment of the present invention, the heat treatment may be preferably performed under a hydrogen gas atmosphere, an argon gas atmosphere, or a hydrogen-argon mixed gas atmosphere. The hydrogen gas, argon gas, or hydrogen-argon mixed gas may be injected at 1 to 500 sccm. In a case where the hydrogen-argon mixed gas is injected, a mixed ratio (sccm ratio) of hydrogen gas to argon gas may be 1:0.1 to 10, but the present invention is not limited thereto. The heat treatment is performed under the hydrogen gas atmosphere or the hydrogen-argon mixed gas atmosphere, such that oxidation of the metal foil may be prevented and migration of metal atoms may be accelerated to promote grain growth.

In addition, the present invention provides a monocrystalline metal foil manufactured by the method for manufacturing a monocrystalline metal foil described above.

Specifically, the monocrystalline metal foil according to an exemplary embodiment of the present invention may have the same crystal plane on both surfaces thereof, and a thickness of 5 to 200 μm. More specifically, the following Relational Expression 3 may be satisfied. In this case, a size of a specimen for calculating Relational Expression 3 is not particularly limited. In an exemplary embodiment, $A_{normal}/A_{total}$ may be measured based on a specimen having a size of 1 cm×4 cm.

$$95 \leq (A_{normal}/A_{total}) \times 100 \qquad \text{[Relational Expression 3]}$$

(In Relational Expression 3, $A_{total}$ represents a total area of a specimen except for regions fixed by the electrodes, and $A_{normal}$ represents an area of grains having the same crystal plane in a plane normal direction in the specimen, where the same crystal plane is a (110), (111), (001), (112), (123), or (0001) crystal plane.)

As described above, in the present invention, each of the ends of the polycrystalline metal foil are fixed by the electrodes, respectively, such that a metal foil region (a region except for end portions fixed by the electrodes), which can be converted to being a monocrystalline region does not come in contact with other materials. Therefore, the occurrence of the grain growth pinning from the contact portion may be minimized.

In addition, even in a case where each of the ends of the polycrystalline metal foil are fixed by the electrodes, respectively, and the length of the polycrystalline metal foil is increased due to the thermal expansion through the heat treatment, the polycrystalline metal foil is kept straight again by moving positions of the electrodes and then the heat treatment is performed, such that undesirable stress is prevented. Therefore, a monocrystalline metal foil having a large area may be secured.

In addition, as both surfaces of the poly-crystalline metal foil may be thermally treated under the same conditions as each other by positioning the poly-crystalline metal foil to be spaced apart from others, such as a chamber, conversion to monocrystalline metal foil may be more effectively performed. Therefore, both surfaces of the manufactured monocrystalline metal foil may have the same crystal plane on both surfaces thereof. In addition, as the monocrystalline metal foil may have the same crystal plane in each of the in-plane and out-of-plane directions, monocrystalline metal foil having high quality may be manufactured. More specifically, the monocrystalline metal foil may have a (111), (001), (112), (123), or (0001) crystal plane in the plane normal direction.

As such, the monocrystalline metal foil having high quality and a large area according to the present invention may be used in any field in which an existing polycrystalline or monocrystalline metal foil has been used without a particular limitation. As a specific example, based on excellent electrical conductivity and thermal conductivity of a monocrystalline metal as compared to a poly-crystalline metal, the monocrystalline metal foil may be used as a high-performance metal component material throughout fields of electric and electronic products such as a printed circuit board and a heat sink. Particularly, a high-efficiency component suitable for the trend toward miniaturization and high integration of electric and electronic products may be provided. Further, the monocrystalline metal foil manufactured according to the present invention may have uniform surface crystal orientation, such that the monocrystalline metal foil may be widely utilized as a catalyst for synthesis of graphene and 2-dimensional nano-materials and various chemical reactions.

In addition, the present invention provides an apparatus for manufacturing a monocrystalline metal foil capable of manufacturing the monocrystalline metal foil described above.

Specifically, the apparatus for manufacturing a monocrystalline metal foil according to an exemplary embodiment of the present invention may include a chamber and a metal foil heating unit. The chamber may include a first fixing unit and a second fixing unit positioned to be spaced apart from each other and provided to fix a polycrystalline metal foil; and a distance adjustment unit connected to the first fixing unit, the second fixing unit, or the first fixing unit and the second fixing unit to adjust a spaced distance between the first fixing unit and the second fixing unit.

Specifically, in an exemplary embodiment of the present invention, the first fixing unit and the second fixing unit may include a first electrode and a second electrode, respectively, to be electrified, and the metal foil heating unit is connected to the first electrode and the second electrode.

In an exemplary embodiment of the present invention, the first electrode and the second electrode may be provided at each of the ends of the polycrystalline metal foil to be spaced apart from each other as illustrated in FIG. 1a, and may have a form to fix the polycrystalline metal foil. As an example, electrodes may be fixed by bolts after the polycrystalline metal foil is positioned between two bars or roll type electrodes around which a foil is wound may be fixed. However, this is only one exemplary embodiment, a form of the electrode is not particularly limited as long as the electrode may fix the polycrystalline metal foil, and the present invention is not limited thereto.

The first electrode and the second electrode may be generally used in the related art. As a non-limiting example, the first electrode and the second electrode may be each independently a gold (Au) electrode, a silver (Ag) electrode, a copper (Cu) electrode, an iron (Fe) electrode, or an alloy electrode thereof. The first electrode and the second electrode may be each independently formed of a metal having excellent conductivity, such as gold, silver, platinum, copper, iron, or nickel, or alloys thereof, and may be plated with these metals, but the present invention is not limited thereto.

In an exemplary embodiment of the present invention, the metal foil heating unit is provided to convert to monocrystal by increasing the temperature of the polycrystalline metal foil. The metal foil heating unit may include a heater separated from the first fixing unit and the second fixing unit and that is placed inside or outside the chamber. Specifically, any metal foil heating unit may be used without a particular limitation as long as the temperature of the polycrystalline metal foil may thus be increased to a desired temperature. Specifically, for example, the metal foil heating unit may perform heating through resistive heating.

In addition, in an exemplary embodiment of the present invention, the metal foil heating unit may further include a cooling device. The cooling device may be included in order to prevent deformation of the electrode by a high temperature generated in a polycrystalline or monocrystalline metal foil, and bonding and various chemical reactions between the electrodes and the polycrystalline or monocrystalline metal foil during the heat treatment. Any cooling device may be used without a limitation as long as it is included in the chamber and may lower a temperature of the chamber.

Meanwhile, in an exemplary embodiment of the present invention, the distance adjustment unit is provided to maintain the polycrystalline metal foil kept straight in by adjusting the spaced distance between the first fixing unit and the second fixing unit through adjustment of a position of the first fixing unit, a position of the second fixing unit, or the positions of the first fixing unit and the second fixing unit. Any distance adjustment unit may be used without limitations in the type and material thereof as long as the positions of the first fixing unit, the second fixing unit, or the first fixing unit and the second fixing unit may be adjusted. As an exemplary embodiment, the distance adjustment unit may have a form such as a movable stage in contact with and connected to a lower electrode, as illustrated in FIG. 1a. The spaced distance between the first fixing unit and the second fixing unit may be adjusted by moving the movable stage up and down. However, this is only one example, the type and material of the distance adjustment unit are not particularly limited as long as the position of the first fixing unit or the second fixing unit may be moved, and the present invention is not limited thereto.

In addition, the apparatus for manufacturing a monocrystalline metal foil according to an exemplary embodiment of the present invention may further include: a gas inlet injecting gas to the chamber; and a gas outlet discharging the gas from the chamber. The gas inlet may be provided to inject gas that may adjust a heat treatment atmosphere in the chamber during the heat treatment, and specifically, to inject hydrogen, argon, or hydrogen-argon mixed gas to the chamber. The gas outlet may be provided to discharge the hydrogen, argon, or hydrogen-argon mixed gas or air filled in the chamber before injecting the hydrogen, argon, or hydrogen-argon mixed gas.

In addition, the apparatus for manufacturing a monocrystalline metal foil according to an exemplary embodiment of the present invention may further include a pressure adjustment unit connected to the chamber. The pressure adjustment unit is provided to appropriately adjust a pressure inside the chamber, and may adjust the pressure inside the chamber by adjusting the amount and speed of the gas introduced through the gas inlet or discharged through the gas outlet. That is, when the pressure inside the chamber is low, the pressure inside the chamber may be increased by introducing gas into the chamber through the gas inlet, and when the pressure inside the chamber is high, the pressure inside the chamber may be decreased by discharging the gas inside the chamber through the gas outlet.

Hereinafter, the monocrystalline metal foil and the method for manufacturing the same according to the present invention will be described in more detail with reference to examples. However, the following examples are only one reference example for describing the present invention in detail, and the present invention is not limited thereto and may be implemented in various forms.

Unless otherwise defined, all technical terms and scientific terms used herein have the same meanings as commonly understood by those skilled in the art to which the present invention pertains. The terms used herein are only for effectively describing a certain example rather than limiting the present invention. Further, unless otherwise stated in the present specification, a unit of an additive may be wt %.

Example 1

As illustrated in FIG. 1a, an apparatus having a lower electrode and an upper electrode whose upper and lower positions may be changed was prepared, and then a polycrystalline platinum foil having a thickness of 50 μm and a size of width: 1 cm×length: 5 cm was fixed between the upper electrode and the lower electrode so that the polycrystalline platinum foil was kept straight. In this case, copper plated with nickel was used for each electrode, regions of width: 1 cm×length: 0.5 cm of each of the ends of the foil were fixed by bolts at electrodes including two bars in order to fix the foil to the electrodes.

Subsequently, temperatures of the two electrodes and the polycrystalline platinum foil were increased up to 1610° C. over 16 minutes (100° C. per minute) by a resistive heating (Joule heating) method, and the polycrystalline platinum foil was kept straight again by moving the lower electrode downwards by a length changed by thermal expansion of the polycrystalline platinum foil.

Thereafter, a monocrystalline platinum foil was manufactured by performing a heat treatment for about 12 hours while keeping the polycrystalline platinum foil straight at 1610° C., and the monocrystalline platinum foil was kept straight by returning the lower electrode to the original position while lowering the temperature to room temperature (about 25° C.) after the heat treatment. As a result, a monocrystalline platinum foil having an identical orientation both plane normal and in-plane direction in large area could be manufactured.

Figure 1C:
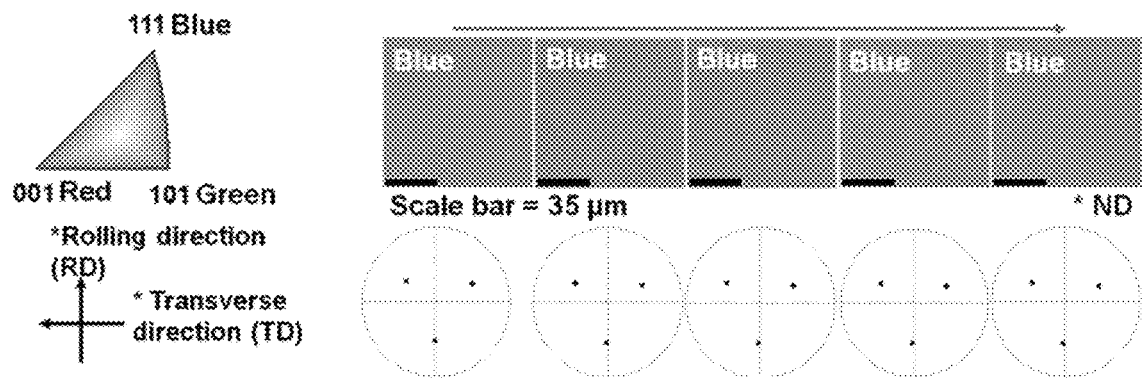
FIG. 1c illustrates inverse pole figure (IPF) map of the monocrystalline platinum foil manufactured in FIG. 1B measured by electron backscatter diffraction (EBSD).

The platinum foil of FIG. 1 is spaced in the vertical direction. However, it may be assumed that, in a case where the polycrystalline platinum foil may be kept straight by controlling a spaced distance between the two electrodes even when the platinum foil is spaced horizontally or spaced at other angles, a monocrystalline platinum foil may be formed without any grain boundaries.

Comparative Example 1

All processes were performed in the same manner as those in Example 1, except that, unlike Example 1, the heat treatment was performed in a state in which the position of the lower electrode was fixed without movement.

Figure 2C:
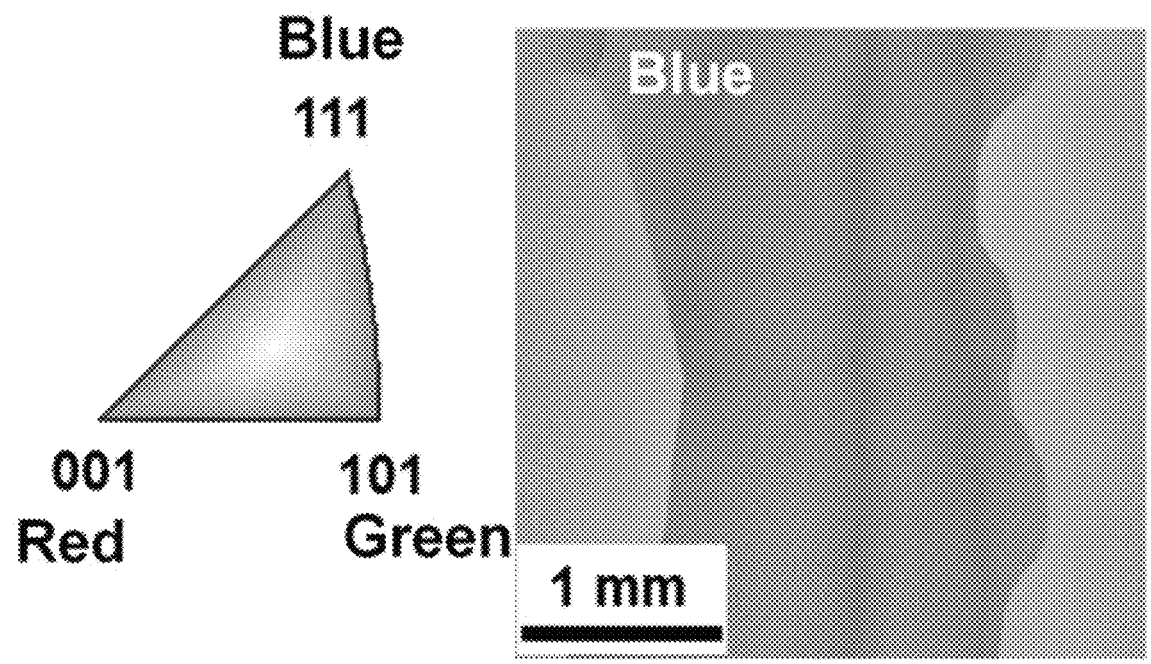
FIG. 2c illustrates inverse pole figure (IPF) maps (EBSD) of the platinum foil manufactured in FIG. 2b measured by electron backscatter diffraction.

As a result, as illustrated in FIG. 2, bending deformation occurred at the middle portion of the polycrystalline platinum foil due to the increased length of the polycrystalline platinum foil by the thermal expansion, and grain boundaries were formed around the deformed portion and an area of the monocrystalline platinum foil became smaller.

Example 2

Nickel, palladium, and cobalt polycrystalline foils were converted into monocrystalline foils in the same manner as that of Example 1, except that the heat treatment temperature was changed. The polycrystalline nickel foil having a thickness of 100 μm and a size of width: 1 cm×length: 5 cm was subjected to a heat treatment at 1380° C. for 3 hours, the polycrystalline palladium foil having a thickness of 75 μm and a size of width: 1 cm×length: 5 cm was subjected to a heat treatment at 1400° C. for 3 hours, and the polycrystalline cobalt foil having a thickness of 50 μm and a size of width: 1 cm×length: 5 cm was subjected to a heat treatment at 1400° C. for 6 hours, thereby manufacturing the nickel, palladium, and cobalt monocrystalline metal foils as illustrated in FIG. 3.

Hereinabove, although the present invention has been described by specific matters and limited exemplary embodiments, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the exemplary embodiments described, but the claims and all of modifications equal or equivalent to the claims are intended to fall within the spirit of the present invention.

The invention claimed is:

1. A method for manufacturing a monocrystalline metal foil, the method comprising:
    a) a step of fixing each end of a polycrystalline metal foil by electrodes, respectively; and
    b) a step of heat treating the fixed polycrystalline metal foil to manufacture a monocrystalline metal foil,
    wherein the step a) further comprises a step of keeping the polycrystalline metal foil straight with a minimized stress applied to the polycrystalline metal foil by moving one or more electrodes which are fixing each end of the polycrystalline metal foil, respectively, before the step b) of heat treating the fixed polycrystalline metal foil,
    wherein the ends of the polycrystalline metal foil are opposite two edges of the polycrystalline metal foil, and a non-fixed portion, which is a region of the polycrystalline metal foil except for regions fixed by the electrodes is free of contact with solid materials, and
    wherein heat treating is performed while maintaining the polycrystalline metal foil in a straightened state by moving the one or more electrodes by a movement distance no greater than to an increased length of the polycrystalline metal foil due to thermal expansion.

2. The method of claim 1, wherein the heat treatment is performed by resistive heating.

3. The method of claim 1, wherein the step b) is performed by including:
    i) a primary heat treatment step of increasing a temperature of the polycrystalline metal foil by applying a current to the polycrystalline metal foil using the electrodes; and
    ii) a secondary heat treatment step of performing annealing at a finally increased temperature for a predetermined time.

4. The method of claim 3, wherein, in the primary heat treatment in the step i), the temperature is increased up to a temperature in the secondary heat treatment in the step ii).

5. The method of claim 4, wherein the temperature in the secondary heat treatment satisfies the following Relational Expression 2, $$0.3 \times T_m \leq T < T_m \qquad \text{[Relational Expression 2]}$$

(in Relational Expression 2, T represents a temperature (° C.) in the secondary heat treatment, and $T_m$ represents a melting point temperature (° C.) of a metal of the polycrystalline metal foil).

6. The method of claim 1, wherein a thickness of the polycrystalline metal foil is 5 to 200 μm.

7. The method of claim 1, wherein a metal of the polycrystalline metal foil is copper (Cu), nickel (Ni), cobalt (Co), iron (Fe), ruthenium (Ru), rhodium (Rh), palladium (Pd), platinum (Pt), silver (Ag), rhenium (Re), iridium (Jr), gold (Au), titanium (Ti), zirconium (Zr), hafnium (Hf), vanadium (V), niobium (Nb), tantalum (Ta), chromium (Cr), molybdenum (Mo), tungsten (W), aluminum (Al), zinc (Zn), manganese (Mn), or tin (Sn).

8. The method of claim 1, wherein the monocrystalline metal foil has the same crystal plane on both surfaces thereof.

9. The method of claim 1, wherein the monocrystalline metal foil has a (110), (111), (001), (112), (123), or (0001) crystal plane based on a direction perpendicular to a plane.

10. The method of claim 1, wherein the heat treatment is performed under a hydrogen gas atmosphere, an argon gas atmosphere, or a hydrogen-argon mixed gas atmosphere.

* * * * *